United States Patent
Chi et al.

(10) Patent No.: US 7,199,733 B2
(45) Date of Patent: Apr. 3, 2007

(54) VARIABLE LENGTH DECODING APPARATUS AND METHOD FOR THE IMAGE FORMAT OF A DIGITAL VIDEO CAMERA

(75) Inventors: Fu-Chung Chi, Taipei (TW); Chih-Liang Wu, Taipei (TW)

(73) Assignee: Ali Corporation, Taipei (TW)

( * ) Notice: Subject to any disclaimer, the term of this patent is extended or adjusted under 35 U.S.C. 154(b) by 307 days.

(21) Appl. No.: 11/073,674

(22) Filed: Mar. 8, 2005

(65) Prior Publication Data

US 2006/0097897 A1 May 11, 2006

(30) Foreign Application Priority Data

Nov. 5, 2004 (TW) .............................. 93133879 A

(51) Int. Cl.
*H03M 7/40* (2006.01)

(52) U.S. Cl. .......................................... 341/67; 341/65

(58) Field of Classification Search ................. 341/58, 341/59, 60, 65, 67, 106; 382/246, 233, 238, 382/239, 232, 250
See application file for complete search history.

(56) References Cited

U.S. PATENT DOCUMENTS

| | | | | |
|---|---|---|---|---|
| 5,557,271 A | * | 9/1996 | Rim et al. ..................... | 341/67 |
| 5,675,332 A | * | 10/1997 | Limberg ....................... | 341/67 |
| 5,696,506 A | * | 12/1997 | Yu .............................. | 341/67 |
| 5,696,507 A | * | 12/1997 | Nam ............................ | 341/67 |
| 5,835,035 A | * | 11/1998 | Bakhmutsky ................ | 341/67 |
| 5,973,627 A | * | 10/1999 | Bakhmutsky ................ | 341/67 |
| 5,990,812 A | * | 11/1999 | Bakhmutsky ................ | 341/67 |
| 2005/0174270 A1 | * | 8/2005 | Koo et al. ..................... | 341/67 |

\* cited by examiner

*Primary Examiner*—Linh V. Nguyen
(74) *Attorney, Agent, or Firm*—Birch, Stewart, Kolasch & Birch, LLP

(57) ABSTRACT

A variable length decoding apparatus and method for the image format of a digital video camera (DV) is provided for decoding the images of a digital video camera on the PASS2 decoding layer. The apparatus comprises a first register, a second register, a third register and a fourth register for saving a bit stream, a barrel shifter for producing output data with a length of sixteen bits, a bit stream generator for generating the combined bit stream, a programmable logic array for decoding the image by looking up the table, a controller for controlling the decoding process and fixed length decode, and an accumulator for accumulating the bit number of the bit stream that is being decoded. The present apparatus can decode much higher frequency components, and the quality of the decoded image is better and the color of the decoded image is more vivid.

7 Claims, 5 Drawing Sheets

| sort of block | Block with an EOB? | bit data of residual bit stream | number of bit data |
|---|---|---|---|
| block Y0 | Yes EOB | 11100 | number of bit data=5 |
| block Y1 | Yes EOB | 1001100110101110 | number of bit data=16 |
| block Y2 | No EOB | 11000 | number of bit data=5 |
| block Y3 | Yes EOB | 0101101001011 | number of bit data=13 |
| block Cr | No EOB | 11110 | number of bit data=5 |
| block Cb | Yes EOB | 11101000010110100 | number of bit data=17 |

VARIABLE LENGTH DECODING APPARATUS AND METHOD FOR THE IMAGE FORMAT OF A DIGITAL VIDEO CAMERA

BACKGROUND OF THE INVENTION

1. Field of the Invention

The present invention relates to a variable length decoding apparatus and method for the image format of a digital video camera (DV). In particular, this invention provides an apparatus and method for decoding the images of a digital video camera on the PASS2 decoding layer.

2. Description of the Related Art

All video encoding standards, such as MPEG, WMV, DV etc., have the same syntax for the encoded bit stream, except DV. In MPEG format, the bit stream is continuous and the length for allocating the encoded bit stream of the macro block is not fixed; that depends on the length of the encoded bit stream. A macro block includes six blocks. However, in DV video format, the length for allocating the encoded bit stream of the macro block is fixed. The length is eighty bytes. In the DV video format, if we use 4:1:1 encoding format to encode a block, the luminance block only occupies fourteen bytes and the chrominance block only occupies ten bytes. The length of encoded bit stream of the block sometimes will exceed the size of the allocated block and sometimes the length of encoded bit stream of the block will be less than the size of the allocated block. When the size of the encoded bit stream of the block exceeds the size of the allocated block, the surplus part of the encoded bit stream will be saved in the neighboring block. Therefore, when decoding, there are three decoding layers for decoding the encoded bit stream of the image. The three decode layers are called PASS1 decoding layer, PASS2 decoding layer, and PASS3 decoding layer.

The PASS1 decoding layer is a basic decoding layer. The PASS1 decoding layer only decodes the data within the allocated block or at the end of a block (EOB). The coefficients of high frequency that are not decoded will be filled in as zero. The PASS2 decoding layer uses a macro block as a unit. If the size of the coefficient of the encoded image is over than that of the allocated block, the PASS2 decoding layer will decode the bit stream that are located in the neighboring block within the macro block. The method combines the residual bit stream of the allocated block with the bit streams allocated in the neighboring block and decodes them by looking up a table. The PASS2 decoding layer will decode the bit streams within the macro block. Other coefficients of high frequency that exceed the macro block will be filled in as zero. The PASS3 decoding layer operates in the same way as the PASS2 decoding layer; the only difference being that the PASS3 decoding layer uses a video segment as a decoding unit. A video segment has five macro blocks.

Please refer to FIG. 1, which shows the prior space allocations of the bit stream of the PASS1 decoding layer for a DV image format. A macro block 10 is composed of six blocks Y0, Y1, Y2, Y3, Cr and Cb. The blocks Y0, Y1, Y3 and Cb have end of blocks (EOB) 11, 12, 13 and 14. The blocks Y2 and Cr don't have an EOB.

Refer to FIG. 2, which shows the prior variable length decoder of the PASS1 decoding layer for DV image format. The apparatus comprises two registers 20 and 21 for saving the decoding bit stream, a barrel shifter 22 for outputting data produced by the bit stream and uses sixteen bits as a unit, an accumulator 24 for accumulating the bit number of the bit stream that is being decoded. The result of the accumulator will be sent to the barrel shifter 22, a programmable logic array 23 for decoding the image according to the output data of barrel shifter 22, a controller 26 for controlling the decoding process and the bit number of fixed length decode, and a multiplexer 25 for switching the input of the accumulator 24, the input of the multiplexer 25 includes the bit number which comes from the look-up table through the programmable logic array 23 and the bit number of fixed length decode from the controller 26.

The prior variable length decoder of the PASS1 decoding layer for DV image format will only decode the bit stream until the EOB of the block or the allocated address of the block. Other coefficients of high frequency components will be filled in as zero. Therefore, the prior art will lose the high frequency component and can't be applied to the PASS2 decoding layer.

SUMMARY OF THE INVENTION

The main purpose of the present invention is to provide a variable length decoding apparatus and a method for the image format of digital video camera (DV). In particular, this invention provides an apparatus and method for decoding the images of a digital video camera on the PASS2 decoding layer. The present apparatus can decode much more of the high frequency components. Besides, the quality of the decoded image is better and the color of the decoded image is more vivid.

In order to achieve the above goal, the present invention provides a variable length decoding apparatus for the image format of a digital video camera (DV). The apparatus comprises a first register and a second register for saving a bit stream which is being decoded, a third register for saving a combined bit stream, a fourth register for saving a residual bit stream, a first multiplexer for switching the bit streams. The input of the first multiplexer includes the bit stream which is decoded and the combined bit stream, a barrel shifter for producing output data with a length of sixteen bits according to the bit streams of the first register and the second register, a bit stream generator for generating the combined bit stream by combining the residual bit streams of all blocks which have an EOB, a bit stream combining generator for combining the residual bit stream of the fourth register and the part output of the barrel shifter, a second multiplexer for switching the bit stream combining generator and the barrel shifter, a programmable logic array connected to the output of the second multiplexer for decoding the image by looking up the table according to the data from the output of the second multiplexer.

The present variable length decoding apparatus for the image format of a digital video camera (DV) also comprises a controller for controlling the decoding process and fixed length decode, a third multiplexer connected to the programmable logic array and the controller. The input of the third multiplexer includes the bit number which comes from the look-up table through the programmable logic array and the bit number of fixed length decode from the controller, an accumulator connected to the third multiplexer and the barrel shifter, for accumulating the bit number of the bit stream that is being decoded. The result of the accumulator will be provided to the barrel shifter in order to do a shifting operation.

The present variable length decoding apparatus for the image format of a digital video camera (DV) can decode the image in the PASS2 decoding layer. It requires a simple modification and can improve the decoding quality of high frequency images.

For further understanding the invention, reference is made to the following detailed description illustrating the embodiments and examples of the invention. The description is only for illustrating the invention instead of limiting the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
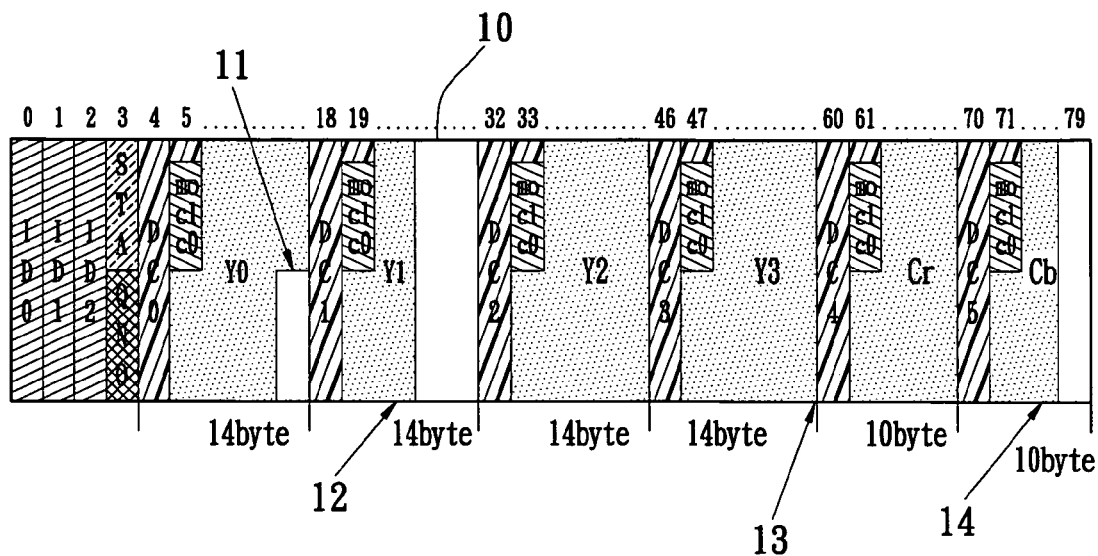
FIG. 1 is a schematic diagram of the space allocation of a bit stream of the prior PASS1 decoding layer for the DV image format.
Figure 2:
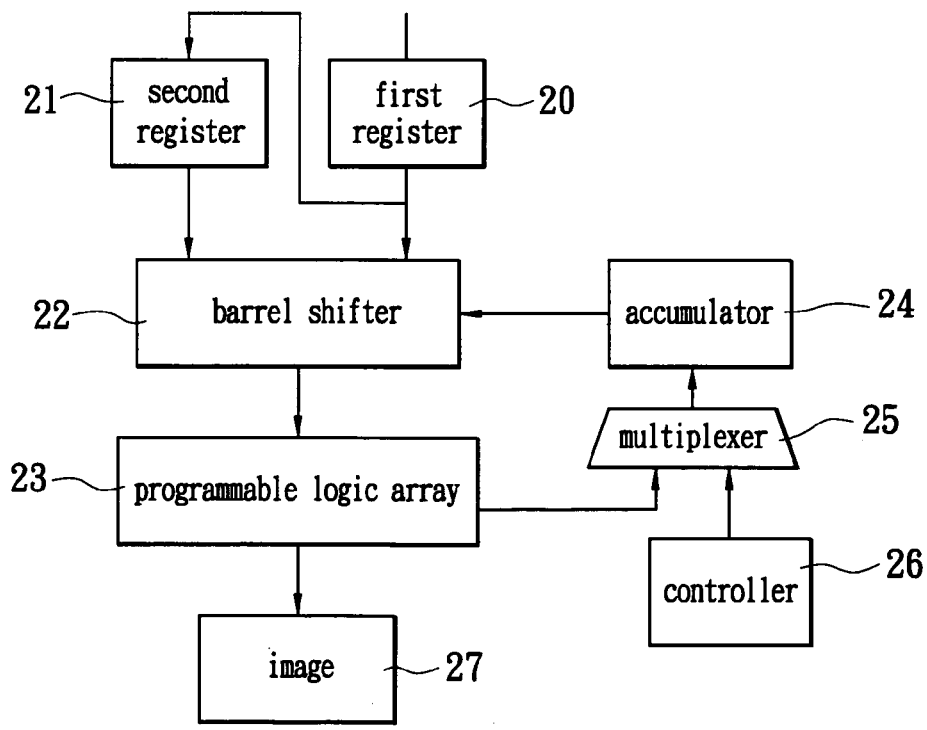
FIG. 2 is a circuit diagram of the prior variable length decoder for the DV image format.
Figures 3A, 3B:
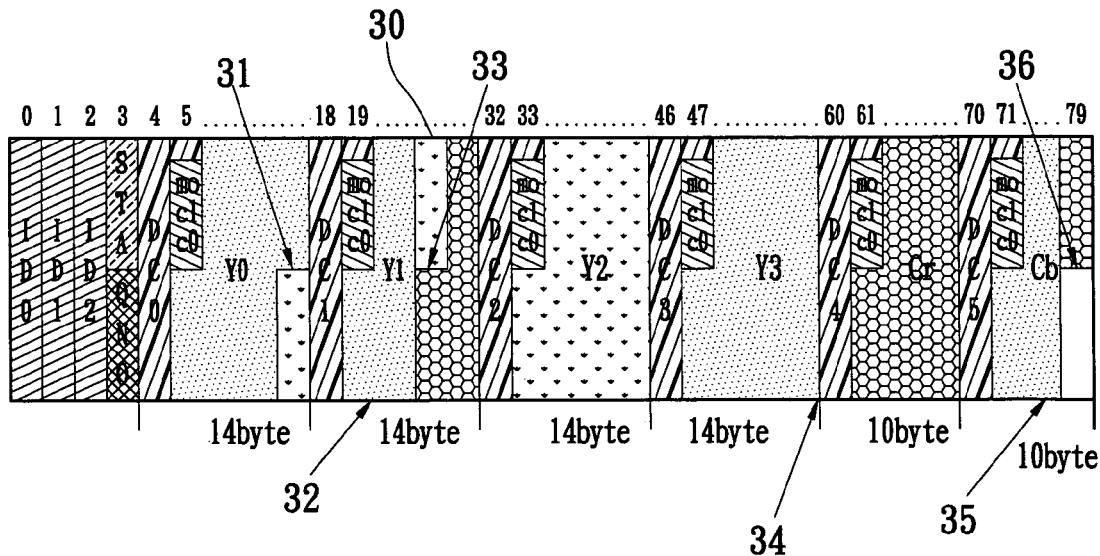
FIG. 3A is a schematic diagram of the space allocation of bit stream of the prior PASS2 decoding layer for the DV image format.
FIG. 3B is a statistical diagram of the block status of the present PASS2 decoding layer for the DV image format.

FIG. 3A is a schematic diagram of the space allocation of a bit stream of the PASS2 decoding layer for the DV image format. The diagram shows a macro block 30 composing of six blocks Y0, Y1, Y2, Y3, Cr and Cb. In the allocated address of the block Y0, there is an end of block (EOB) 31 of the block Y0. In the allocated address of the block Y1, there is an EOB 32 of the block Y1 and an EOB 33 of the block Y2. In the allocated address of the block Y3, there is an EOB 34 of the block Y3. In the allocated address of the block Cb, there is an EOB 35 of the block Cb and an EOB 36 of the block Cr. In the allocated addresses of the block Y2 and the block Cr, there isn't an EOB.

FIG. 3B is a statistical diagram of the status of the image blocks been decoded by the PASS1 decoding layer for the DV image format. The first column is the block and the second column is the status of the blocks in which there is, or isn't, an EOB. The third column is the bit data of the residual bit stream and the fourth column is the bit number of the residual bit stream.

Figure 4:
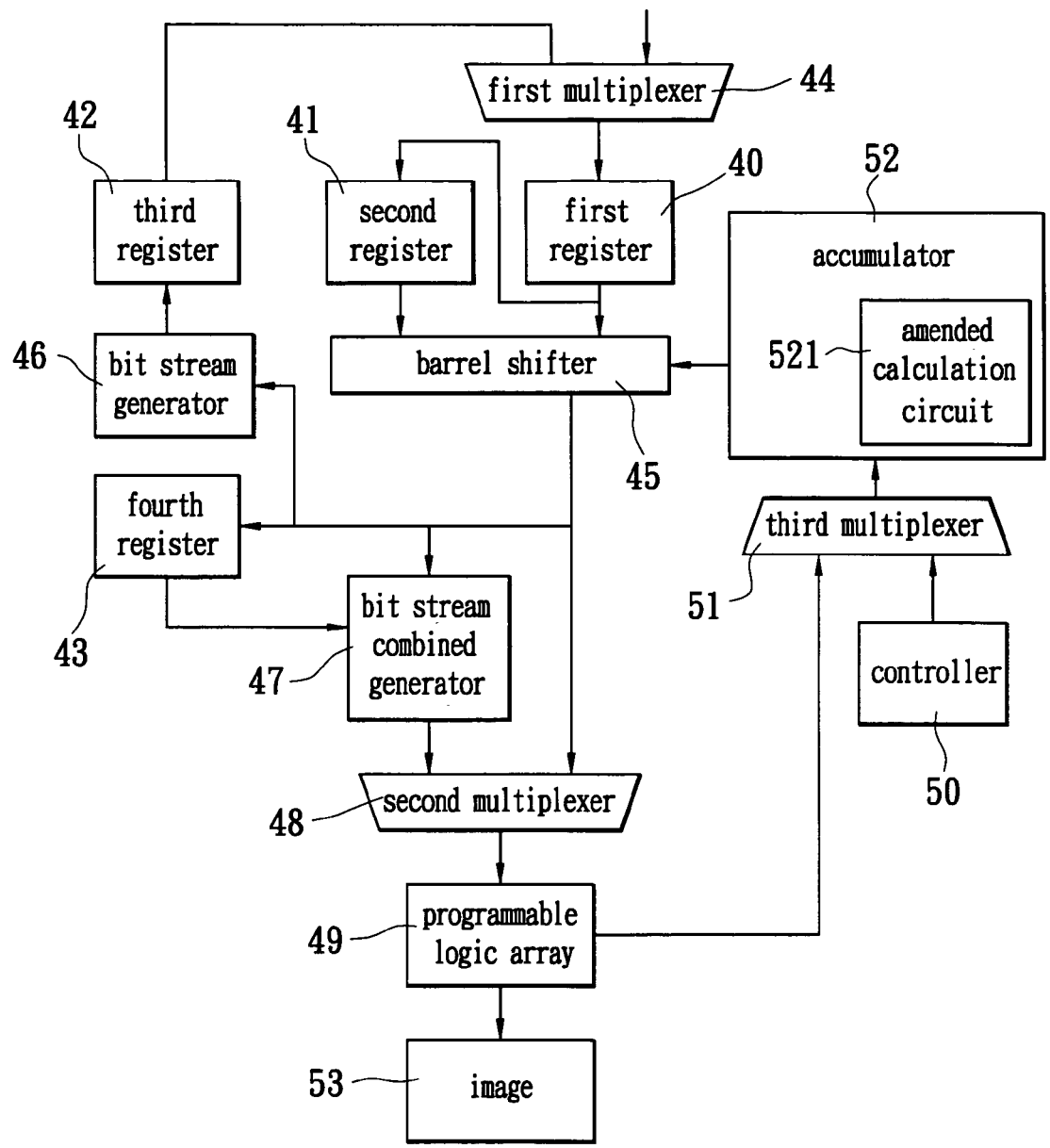
FIG. 4 is a circuit diagram of the present variable length decoder for the DV image format.

Please refer to FIG. 4, which shows a variable length decoding apparatus for the image format of a digital video camera (DV). The present apparatus comprises a first register 40 and a second register 41 for saving a bit stream which is being decoding, a third register 42 for saving a combined bit stream, a fourth register 43 for saving a residual bit stream. The first multiplexer 44 connected to the first register 40 and the third register 42, for switching the bit streams. The input of the first multiplexer 44 includes the bit stream which is being decoding and the combined bit stream, a barrel shifter 45 connected to the first register 40 and the second register 41, for producing output data with a length of sixteen bits according to the bit streams of the first register 40 and the second register 41.

The present invention also comprises a bit stream generator 46 connected to the barrel shifter 45 and the third register 42, for generating the combined bit stream by combining the residual bit streams of all the blocks in which there is an EOB, a bit stream combining generator 47 connected to the fourth register 43 and the barrel shifter 45, for combining the residual bit stream of the fourth register 43 and the part output of the barrel shifter 45, a second multiplexer 48 connected to the bit stream combining generator 47 and the barrel shifter 45, for switching the bit stream combining generator 47 and the barrel shifter 45, a programmable logic array 49 connected to the output of the second multiplexer 48, for decoding the image 53 by looking up the table according to the data from the output of the second muliplexer 48.

The present variable length decoding apparatus for the image format of a digital video camera (DV) also comprises a controller 50 for controlling the decoding process and fixed length decode, a third multiplexer 51 connected to the programmable logic array 49 and the controller 50, the input of the third multiplexer 51 includes the bit number which comes from the look-up table through the programmable logic array 49 and the bit number of fixed length decode from the controller 50, an accumulator 52 connected to the third multiplexer 51 and the barrel shifter 45, for accumulating the bit number of the bit stream that is being decoded. The result of the accumulator 52 will be provided to the barrel shifter 45 in order to do a shift operation.

The accumulator 52 further comprises an amended calculation circuit 521 for amending the bit number and provides the amended bit number to the accumulator 52 when the blocks without an EOBs do the first time decode of the PASS2 decoding layer. The function of the amended calculation circuit 521 can be illustrated by the example shown in FIG. 6. The output of the bit stream combining generator 47 is a decoding bit stream 60 that is composed of a residual bit stream of the block without an EOB 602 and the combined bit stream 604 that comes from the part output of the barrel shifter 45. The decoding bit stream 60 is the output of the second muliplexer 48. The length of the residual bit stream of the block without an EOB 602 is five. The length of the combined bit stream 604 that comes from the part output of the barrel shifter 45 is 7 after looking up the table through the programmable logic array 49. So, the real length for the accumulator 52 is 2 (i.e. 7−5=2).

The third register 42 is composed of either a DRAM or a SRAM. The fourth register 43 can be composed of the same DRAM or SRAM, or another.

Figure 6:
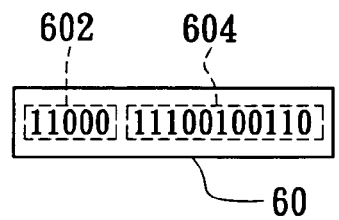
FIG. 6 is a schematic diagram of the output of the bit stream combined generator for the present PASS2 decoding layer in the DV image format.
Figure 7:
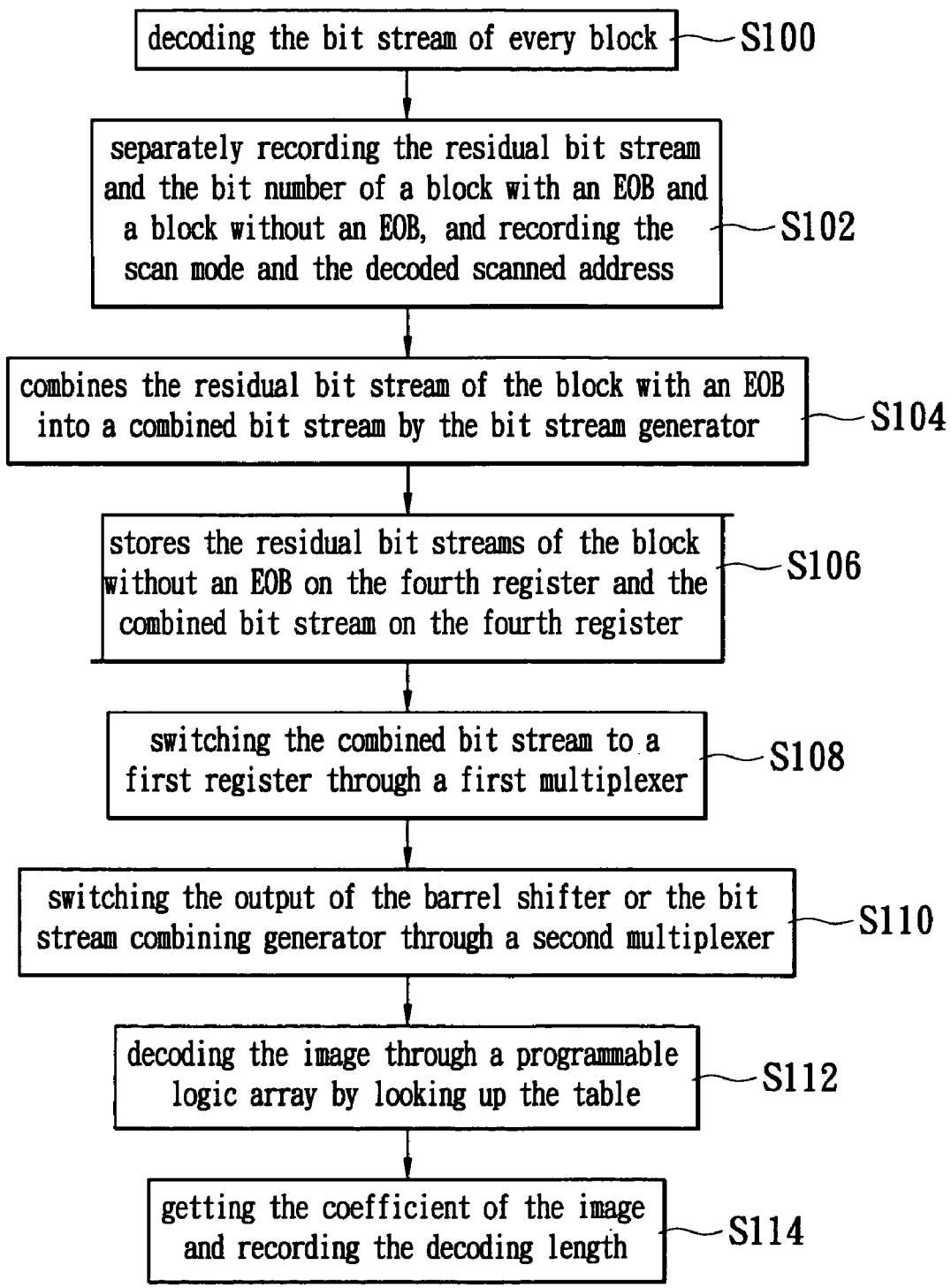
FIG. 7 is a flow chart of the present variable length decoding method for the PASS2 decoding layer in the DV image format.

FIG. 6 shows a flow chart of the present variable length decoding method for the PASS2 decoding layer in the DV image format. The process comprises the following steps:

Decode the bit stream of every block (S100). This is, to do the PASS1 decoding layer decoding.

Separately record the residual bit stream and the bit number of the blocks with an EOB and without an EOB after doing the PASS1 decoding layer decode, and record the scan mode and the decoded scanned address of the highest frequency coefficient (S102). Then, record the residual bit stream and the scan order.

Figure 5A:
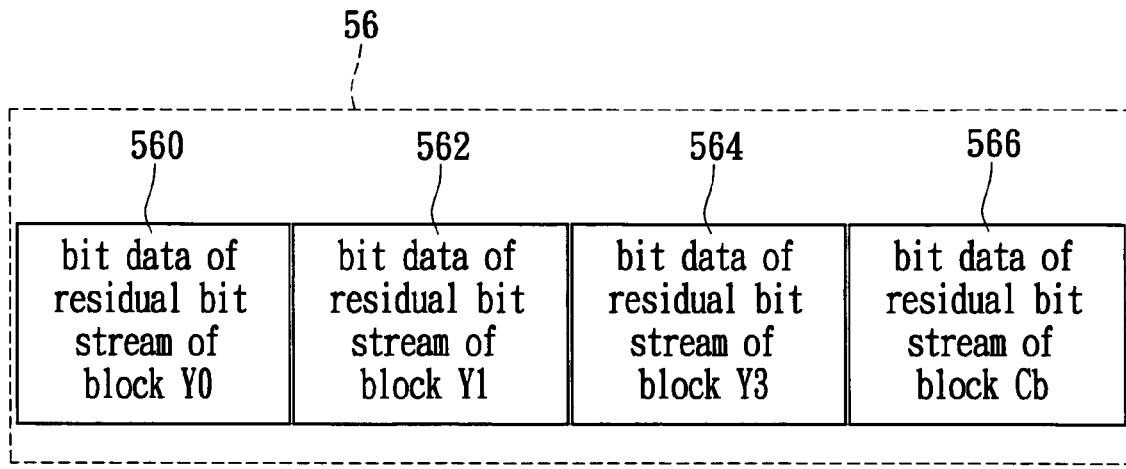
FIG. 5A is a schematic diagram of action using for the bit stream generator for the present PASS2 decoding layer in the DV image format.
Figure 5B:
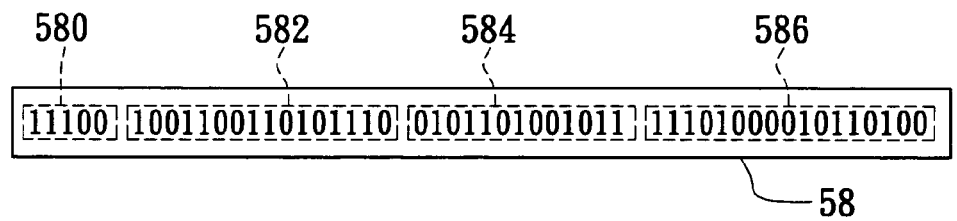
FIG. 5B is another schematic diagram of action using for the bit stream generator for the present PASS2 decoding layer in the DV image format.

Combine the residual bit streams of the block with an EOB into a combined bit stream (S104). Next, combine the residual bit stream of the block with an EOB into combined bit streams 56 and 58 by the bit stream generator 46, (as FIG. 5A, the residual bit streams 560, 562, 564 and 566, and FIG. 5B, the residual bit streams 580, 582, 584 and 586) and record the length of the combined bit streams.

Store the residual bit streams of the block without an EOB (S106) and the combined bit stream. In other words, store the residual bit streams of the block without an EOB on the fourth register 43 shown in FIG. 4 and the combined bit stream on the fourth register. The decoding process of PASS1 decoding layer is finished.

Switch the combined bit stream to a first register through a first multiplexer (S108) and switch the combined bit stream to a first register 40 through a first multiplexer 44 to decode the image on the PASS2 decoding layer.

Switch the output of the barrel shifter or the bit stream to combine generator through a second multiplexer. (S110) When first time decode the block without an EOB on the PASS2 decoding layer, switch to the output of the bit stream combining generator 47, the output data is composed of the residual bit stream of a block without an EOB 602 and the part output of the barrel shifter—the combined bit stream 604 (as shown in FIG. 6, the decoding bit stream 60 is composed of the residual bit stream of a block without an EOB 602 and the part output of the barrel shifter—the combined bit stream 604).

Decode the image through a programmable logic array by looking up the table (S112).

Get the coefficient of the image and record the decoding length (S114).

The steps S108 to S114 are repeated until all blocks without an EOB are decoded or decoded to the end of the macroblock. We need to switch to the output of the bit stream to combine generator 47 for the first time decode and switch to the output of the barrel shifter 45 for subsequent time decodes through the second multiplexer 48.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A variable length decoding apparatus for the image format of a digital video camera, comprising:
    a first register, for saving a bit stream which is being decoded;
    a second register, for saving a bit stream which is being decoded;
    a third register, for saving a combined bit stream;
    a fourth register, for saving a residual bit stream;
    a first multiplexer, for switching the bit streams, connected to the first register and the third register, the input of the first multiplexer includes the bit stream which is being decoded and the combined bit stream;
    a barrel shifter connected to the first register and the second register, for producing output data with a length of sixteen bits according to the bit streams of the first register and the second register;
    a bit stream generator connecting to the barrel shifter and the third register, for generating the combined bit stream by combining the residual bit streams of all blocks in which there is an EOB;
    a bit stream combining generator connected to the fourth register and the barrel shifter, for combining the residual bit stream of the fourth register and the part output of the barrel shifter;
    a second multiplexer connected to the bit stream combining generator and the barrel shifter, for switching the bit stream combining generator and the barrel shifter;
    a programmable logic array connected to the output of the second multiplexer, for decoding the image by looking up the table according to the data from the output of the second muliplexer;
    a controller for controlling the decoding process and fixed length decode;
    a third multiplexer connected to the programmable logic array and the controller, the input of the third multiplexer includes the bit number which comes from the look-up table through the programmable logic array and the bit number of fixed length decode from the controller; and
    an accumulator connected to the third multiplexer and the barrel shifter, for accumulating the bit number of the bit stream that is being decoded, the result of the accumulator will be provided to the barrel shifter in order to do a shift operation.

2. The variable length decoding apparatus for the image format of a digital video camera of claim 1, wherein the bit stream combining generator is used for combining the residual bit stream of the fourth register and the part output of the barrel shifter.

3. The variable length decoding apparatus for the image format of a digital video camera of claim 1, wherein the second multiplexer switches to the output of the bit stream combined generator for the first time decode and switches to the output of the barrel shifter for subsequent time decodes when decoding the blocks without an EOB.

4. The variable length decoding apparatus for the image format of a digital video camera of claim 1, wherein the accumulator further comprises an amended calculation circuit for amending the bit number and provides the amended bit number to the accumulator when the blocks without an EOB do the first time decode of the PASS2 decoding layer.

5. The variable length decoding apparatus for the image format of a digital video camera of claim 1, wherein the third register is a DRAM or a SRAM.

6. The variable length decoding apparatus for the image format of a digital video camera of claim 1, wherein the fourth register is composed of the same DRAM or SRAM, or another one.

7. A variable length decoding method for the image format of a digital video camera, comprising:
    decoding the bit stream of every block to do the PASS1 decoding layer decoding;
    separately recording the residual bit stream and the bit number of a block with an EOB and a block without an EOB after doing the PASS1 decoding layer decoding, and recording the scan mode and the decoded scanned address of the highest frequency coefficient;
    combining the residual bit streams of the block with an EOB into a combined bit stream; combines the residual bit stream of the block with an EOB into a combined bit stream by the bit stream generator, and records the length of the combined bit stream;
    storing the residual bit streams of the block without an EOB and the combined bit stream; stores the residual bit streams of the block without an EOB on a register and the combined bit stream on the register;
    switching the combined bit stream to another register through a first multiplexer; switches the combined bit stream to the another register through a first multiplexer and decodes the image on the PASS2 decoding layer;

decoding the bit stream, decodes the bit stream that comes from the barrel shifter or the bit stream combined generator, when decoding on the PASS2 decoding layer, switches to the output of the bit stream to combine generator for the first time decode and switches to the output of the barrel shifter for subsequent time decodes through the second multiplexer.

* * * * *